United States Patent

Barsan et al.

[11] Patent Number: 5,908,308
[45] Date of Patent: Jun. 1, 1999

[54] USE OF BOROPHOSPHOROUS TETRAETHYL ORTHOSILICATE (BPTEOS) TO IMPROVE ISOLATION IN A TRANSISTOR ARRAY

[75] Inventors: Radu Barsan, Saratoga; Jonathan Lin, Milpitas; Sunil Mehta, San Jose, all of Calif.

[73] Assignee: Advanced Micro Devices, Inc., Sunnyvale, Calif.

[21] Appl. No.: 08/980,883

[22] Filed: Nov. 26, 1997

[51] Int. Cl.$^6$ .................... H11L 21/8238; H01L 21/336; H01L 21/76; H01L 21/31; H01L 21/469

[52] U.S. Cl. .................... 438/225; 438/297; 438/439; 438/780; 438/789; 438/790; 438/794

[58] Field of Search .................... 438/297, 439, 438/780, 789, 790, 794, 225

[56] References Cited

U.S. PATENT DOCUMENTS 4,963,502 10/1990 Teng et al. .
5,716,891 2/1998 Kodama .

Primary Examiner—John F. Niebling
Assistant Examiner—Josetta I. Jones
Attorney, Agent, or Firm—Fliesler, Dubb, Meyer & Lovejoy

[57] ABSTRACT

Controlling the thickness of borophosphorous tetraethyl orthosilicate (BPTEOS) used as all or part of the first inter-layer dielectric (ILD0) in manufacturing a semiconductor device containing an array of transistors to control the field leakage between transistors. Reducing field leakage enables the thickness of field oxide, typically used to reduce field leakage, to be reduced to increase device density in the transistor array.

7 Claims, 1 Drawing Sheet

$I_{LEAK1} > I_{LEAK2} > I_{LEAK3}$

USE OF BOROPHOSPHOROUS TETRAETHYL ORTHOSILICATE (BPTEOS) TO IMPROVE ISOLATION IN A TRANSISTOR ARRAY

BACKGROUND OF THE INVENTION

1. Field of the Invention

The present invention relates to materials used in the manufacture of a semiconductor device which includes an array of transistors to achieve isolation between transistors. More particularly, the present invention relates to materials used in the manufacture of a semiconductor device containing a non-volatile memory array to achieve isolation between transistors.

2. Description of the Related Art

FIG. 1 shows a cross section of two NMOS transistors illustrating the typical configuration of materials used in the manufacture of a semiconductor device containing an array of transistors. The transistors are shown formed in a p-type silicon substrate 2. A first transistor 4 includes n-type source and drain implant regions 6 and 8 provided in the substrate 2. A polysilicon gate region 10 of the first transistor 4 is provided bridging the source 6 and drain 8 regions. The polysilicon gate region 10 is separated from the substrate 2 by a first inter-layer dielectric (ILD0) 22. A second transistor 14 includes n-type source and drain implant regions 16 and 18 provided in the substrate 2. A polysilicon gate region 20 of the second transistor 14 bridges the source and drain regions 16 and 18.

A field oxide region 24 is provided in the substrate 2 separating region 8 of the first transistor 4 and region 16 of the second transistor 14. A polysilicon layer 26 overlies the field oxide region 24 as well as a portion of the n-type regions 8 and 16. The polysilicon region 26 extends to serve as the gate region for other transistors (not shown) in the array, as do polysilicon regions 10 and 20.

The field oxide region 24 is provided to prevent field leakage between region 8 of the first transistor 4 and region 16 of the second transistor 14. A thickness "t" shown with field oxide layer 24 is set to control leakage current between transistors.

Thickness of the field oxide regions separating transistors typically dictates the distance separating each transistor. In explanation, as shown with respect to field oxide region 24, birds beak regions are formed during application of the field oxide regions. With greater thicknesses required for the field oxide regions to more limit field leakage, the birds beak regions extend further in a direction parallel to the surface of the substrate. With greater birds beak extensions, source and drain regions, such as regions 8 and 16 of adjacent transistors, must be separated by a greater distance. For greater device density, or more transistors provided per unit area of substrate, it is desirable to reduce the birds beak size.

Field leakage current can require the thickness of the field oxide to be significant in a large array of transistors. For memory cell transistors, voltage is typically pumped above a chip pin power supply voltage Vcc by charge pump circuitry on a chip. With significant current leakage, charge pump circuitry provided on the chip must be increased in size to supply necessary program voltages. Even with non-programmable transistors in a large array of transistors, significant additional current must be provided from a power supply, a condition which is undesirable.

With the field oxide layer thickness "t" controlled to set the degree of field leakage current, for a large array of transistors where it is typically desirable to increase array density, the thickness "t" of the field oxide layer may be undesirably large.

The ILD0 layer is typically composed of silicon dioxide, phosphorous silicate glass (PSG), tetraethyl orthosilicate (TEOS), borophosphorous tetraethyl orthosilicate (BPTEOS), or a combination of these materials. Although not shown, other layers of materials are applied above the ILD0 layer to fabricate an array of transistors. The ILD0 layer is provided between the substrate and a first metal layer. A subsequent dielectric layer ILD1 is provided between the first metal layer and a second metal layer, and a further dielectric layer ILD2 is provided between the second metal layer and a third metal layer.

SUMMARY OF THE INVENTION

The present invention enables a thinner field oxide layer to be utilized without an accompanying increase in field leakage. By enabling a thinner field oxide thickness, the present invention enables a reduction in a birds beak size enabling the spacing between transistors, or device density, to be increased.

The present invention further enables increased device density while utilizing materials conventionally used in the manufacture of a transistor array.

The present invention includes the step of adjusting the thickness of a BPTEOS material used as all or part of the ILD0 to control field leakage between transistors. The present invention utilizes the fact that BPTEOS contains negative charge, which significantly lowers field leakage by several orders of magnitude in comparison to TEOS or PSG which are typically utilized as all or part of the ILD0.

By increasing the thickness of the BPTEOS, the field oxide thickness may likewise be reduced. With the field oxide thickness reduced, the birds beak effect is reduced enabling spacing to be reduced between transistors in an array. Device density is, thus, increased.

BRIEF DESCRIPTION OF THE DRAWINGS

Further details of the present invention are explained with the help of the attached drawings in which.

DETAILED DESCRIPTION

Figure 1:
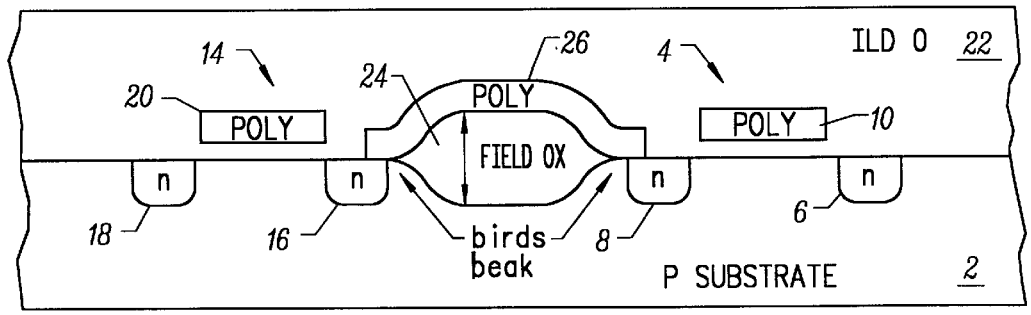
FIG. 1 shows a cross section of two transistors illustrating the typical configuration of materials used in the manufacture of an array of memory cells.

As shown in FIG. 1, in an array of transistors a polysilicon layer 26 may be provided overlying n-type regions 6 and 18 of two separate NMOS transistors as well as a field oxide layer separating the regions 6 and 18. With the ILD0 layer including positive charged material provided overlying the polysilicon layer 26, the polysilicon layer 26 is more likely to conduct to create a parasitic transistor.

Figure 2:
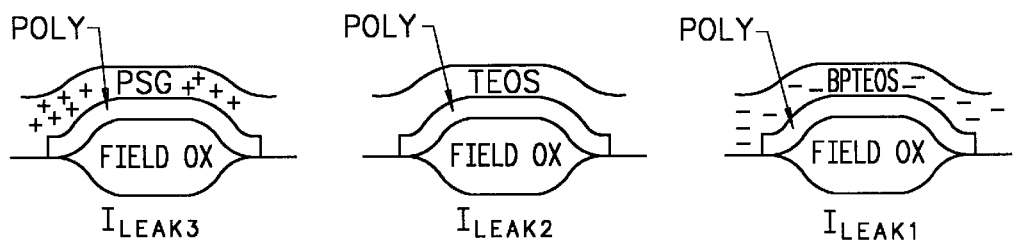
FIG. 2 illustrates charge and field leakage differences between BPTEOS, TEOS and PSG used as the ILD0.

The present invention utilizes the fact that BPTEOS contains significant negative charge. As illustrated by the charges in the ILD0 region shown in FIG. 2, BPTEOS used as the ILD0 layer provides a greater negative charge than either TEOS or PSG used as the ILD0. As further illustrated in FIG. 2, although TEOS provides less positive charge than PSG, boron doping of the TEOS to create BPTEOS provides a further negative charging.

Because of the negative charge of the BPTEOS functioning, as described above, the present invention includes the step of adjusting the thickness of a BPTEOS material used as all or part of the ILD0 during manufacture of a transistor array. By controlling the thickness of the BPTEOS layer provided above a polysilicon region, such as 26, overlying source or drain regions of two adjacent transistors, field leakage through the polysilicon layer can be controlled.

By controlling the thickness of the BPTEOS provided above a polysilicon layer, such as layer 26, the thickness "t" of the field oxide layer, such as 24, beneath the polysilicon layer may be reduced without increasing field leakage current. With the field oxide thickness reduced, the birds beak effect is reduced enabling spacing to be reduced between transistors in an array. Thus, by controlling the thickness of BPTEOS as provided by the present invention, device density in a transistor array may be increased.

As indicated above, BPTEOS may be utilized as all or part of the ILD0 layer. As contemplated by the present invention, the thickness of the BPTEOS material may be controlled to adjust field leakage current irrespective of other materials being included in the ILD0 layer.

Figure 3:
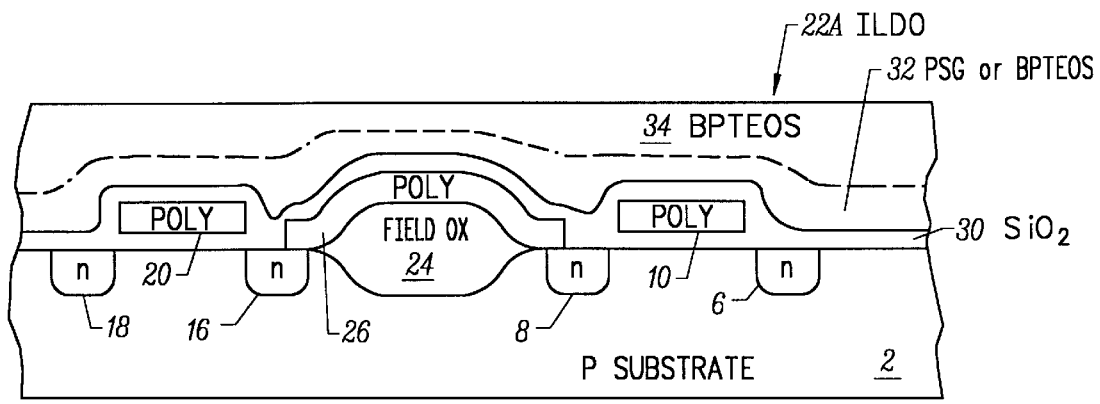
FIG. 3 shows a cross section of two transistors in an array illustrating a typical configuration of materials utilized in the ILD0 layer.

FIG. 3 shows a cross section of two transistors in an array illustrating a typical configuration of materials utilized in the ILD0 layer containing BPTEOS as well as other materials. As shown, the ILD0 layer 22A includes an undoped oxide layer 30, or $SiO_2$ provided above the n-type implant regions 6, 8, 16 and 18, and above the polysilicon regions 10, 20 and 26. The undoped oxide layer 30 further separates the polysilicon regions 10 and 20 from the p-type substrate 2. Above the undoped oxide region either a BPTEOS or PSG layer 32 may optionally be included. Finally, above layer 32 is provided an additional BPTEOS layer 34. Note that regions shown in FIG. 1 which are likewise shown in FIG. 3 are similarly labeled.

PSG was typically used as layer 32 in memory cell transistors because it was believed that the PSG better assured data retention in a floating gate of the memory cell than other materials. PSG helps data retention by blocking hydrogen contamination from subsequent layers which neutralize electrons in the floating gate of a cell reducing its data retention ability over time. Although such a PSG layer 32 is provided more closely to the polysilicon region 26 than the BPTEOS layer 34, the thickness of the BPTEOS layer may still be controlled to control field leakage current.

Although PSG used for the layer 32 was previously believed to provide charge retention for memory cells having a floating gate, BPTEOS used for the layer 32 provides similar data retention properties. BPTEOS like PSG similarly blocks hydrogen contamination from subsequent layers. As illustrated by the leakage current indications $I_{LEAK1}$–$I_{LEAK3}$ in FIG. 2, utilizing BPTEOS reduces field leakage current by several orders of magnitude in comparison to controlling the thickness of TEOS or PSG used as the ILD0. Thus, in a preferred embodiment of the present invention, BPTEOS is utilized for the layer 32, although other materials may be utilized.

Although the invention has been described above with particularity, this was merely to teach one of ordinary skill in the art how to make and use the invention. Many modifications will fall within the scope of the invention, as that scope is defined by the claims which follow.

What is claimed is:

1. A method of manufacturing transistors comprising the steps of:

creating source and drain regions for a first transistor;

creating source and drain regions for a second transistor;

creating a field oxide between the first transistor and the second transistor;

depositing a borophosphorous tetraethyl orthosilicate (BPTEOS) layer above the field oxide with a thickness controlled to provide a predetermined field leakage current from the first transistor to the second transistor.

2. The method of claim 1 further comprising the step of:

depositing a polysilicon region between the BPTEOS layer and the field oxide, the polysilicon region overlying the field oxide and a portion of one of the source and drain regions from each of the first and second transistors.

3. The method of claim 1 wherein the source and drain regions of the first and second transistors are n-type implant regions.

4. The method of claim 1, wherein the thickness of the BPTEOS layer is controlled so that a thickness of the field oxide layer is set to minimize spacing between the first and second transistors.

5. The method of claim 1 further comprising the step of:

depositing phosphorous silicate glass (PSG) above the field oxide.

6. The method of claim 1 further comprising the step of:

depositing tetraethyl orthosilicate (TEOS), which is not doped with boron above the field oxide.

7. A method of manufacturing transistors comprising the steps of:

creating n-type source and drain regions for a first transistor;

creating n-type source and drain regions for a second transistor;

creating a field oxide between the first transistor and the second transistor;

depositing a polysilicon region overlying the field oxide and a portion of one of the source and drain regions from each of the first and second transistors; and depositing a borophosphorous tetraethyl orthosilicate (BPTEOS) layer above the polysilicon region, the BPTEOS having a thickness controlled to provide a predetermined field leakage current from the first transistor to the second transistor.

* * * * *